United States Patent
Wakui et al.

(10) Patent No.: US 7,354,229 B2
(45) Date of Patent: Apr. 8, 2008

(54) DRILL

(75) Inventors: Hideo Wakui, Nagaoka (JP); Shoichi Takahashi, Nagaoka (JP); Hidehito Watanabe, Nagaoka (JP)

(73) Assignee: Union Tool Co., Tokyo (JP)

( * ) Notice: Subject to any disclaimer, the term of this patent is extended or adjusted under 35 U.S.C. 154(b) by 332 days.

(21) Appl. No.: 11/124,095

(22) Filed: May 9, 2005

(65) Prior Publication Data

US 2006/0115339 A1    Jun. 1, 2006

(30) Foreign Application Priority Data

Dec. 1, 2004    (JP) ............... 2004-348156

(51) Int. Cl.
   *B23B 51/00*    (2006.01)
   *B23B 51/02*    (2006.01)

(52) U.S. Cl. ...................... 408/227; 408/230

(58) Field of Classification Search ............... 408/227, 408/230, 228, 229, 704
   See application file for complete search history.

(56) References Cited

U.S. PATENT DOCUMENTS

| | | | | |
|---|---|---|---|---|
| 1,320,985 A | * | 11/1919 | Brightman | 408/230 |
| 3,947,143 A | * | 3/1976 | Gulla | 408/230 |
| 4,913,603 A | | 4/1990 | Friedli et al. | |
| 5,078,554 A | * | 1/1992 | Kubota | 408/230 |
| 5,584,617 A | * | 12/1996 | Houser | 408/1 R |
| 5,685,673 A | * | 11/1997 | Jarvis | 408/230 |
| 5,713,736 A | * | 2/1998 | Heath et al. | 433/102 |
| 5,882,198 A | * | 3/1999 | Taylor et al. | 433/102 |
| 5,947,653 A | * | 9/1999 | Hamberg | 408/59 |
| 5,947,659 A | * | 9/1999 | Mays | 408/211 |
| 5,980,250 A | * | 11/1999 | McSpadden | 433/102 |
| 5,993,119 A | * | 11/1999 | Moller | 408/57 |
| 6,419,488 B1 | * | 7/2002 | McSpadden et al. | 433/102 |

FOREIGN PATENT DOCUMENTS

| | | | |
|---|---|---|---|
| EP | 1340572 A1 | | 9/2003 |
| JP | 56-039807 | | 4/1981 |
| JP | 1-501377 A | | 5/1989 |
| JP | 02-198707 A | | 8/1990 |
| JP | 02-298408 A | | 12/1990 |
| JP | 06320323 A | * | 11/1994 |
| JP | 2001105218 A | * | 4/2001 |
| JP | 2002205213 A | * | 7/2002 |
| JP | 2002205214 A | * | 7/2002 |
| JP | 2003311522 A | * | 11/2003 |
| WO | WO 88/03849 A1 | | 6/1988 |

* cited by examiner

*Primary Examiner*—Dana Ross
*Assistant Examiner*—Michael W. Talbot
(74) *Attorney, Agent, or Firm*—Sughrue Mion, PLLC (57) ABSTRACT

A drill including a chisel edge provided at a tip end portion, a spiral first chip discharging groove and a spiral second chip discharging groove, land portions provided between the first chip discharging groove and the second chip discharging groove, and a cut blade provided at an edge of a rake surface of the first chip discharging groove, characterized in that the first chip discharging groove and the second chip discharging groove are provided asymmetrically with respect to a drill rotational center and a land portion behind the first chip discharging groove is larger than a land portion behind the second chip discharging groove.

26 Claims, 4 Drawing Sheets

DRILL

FIELD OF THE INVENTION

The present invention relates to a drill.

BACKGROUND OF THE INVENTION

Figure 1:
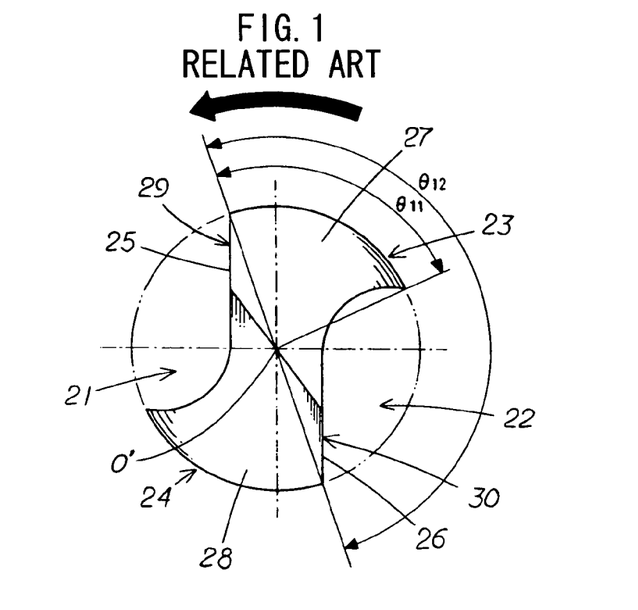
FIG. 1 is a schematic frontal view of a conventional case.

As shown in FIG. 1 (for example, Japanese Patent Application No. Sho 56-39807 (Patent Publication 1)), there is a drill for uniform material such as steel material in which two cutting chip discharging grooves 21 and 22 are formed spirally on an outer circumferential surface; land portions 23 and 24 are provided between the cutting chip discharging grooves 21 and 22; and furthermore, cut blades 29 and 30 are provided along the cross ridge portions between rake surfaces 25 and 26 directed in the drill rotational direction of the cutting tool discharging grooves 21 and 22 and relief surfaces 27 and 28 on the back side of the rake surfaces 25 and 26.

The two cutting chip discharge grooves 21 and 22 are normally provided symmetrically with respect to a point of a drill rotational center. Accordingly, with the type of the drill shown in FIG. 1, it is possible to perform the cutting in a good balance by using the point-symmetric blades and furthermore, it is possible to enhance the cutting chip discharge property to perform the boring work with high precision.

By the way, recently, a small drill for forming holes or the like to a printed circuit board has been spread widely. It is desired to thin and down-size the printed circuit board more and more. Thus, the small diameter drill itself is required to be smaller and smaller in size.

[Patent Publication] Patent Application Sho 56-39807

However, if the diameter of the drill is reduced, the thickness of the drill is also reduced so that the rigidity is deteriorated. It is therefore inevitable to degrade the precision in hole position.

Furthermore, in general, the printed circuit board is formed by impregnating glass cloth, formed by weaving glass fibers, with resin forming a prepreg and by laminating copper foil on the prepreg. The printed circuit board is made of non-uniform composite material unlike the above-described steel material or the like and undulations of the glass cloth sensitively affects the hole position precision. As a result, if the boring of the printed circuit board is performed with the small diameter drill, the hole position precision further deteriorates.

Accordingly, it is difficult to obtain the satisfactory hole position precision by providing two cutting chip discharge grooves and two cut blades to the small diameter drill, particularly, the small diameter drill for the printed circuit board.

In this connection, a structure is proposed to make only one cutting chip discharge groove for keeping a thickness (rigidity) to some extent (in this case, only one cut blade is made). However, in this case, it is difficult to keep a suitable cutting chip discharge path so that the cutting charge discharging property deteriorates. As a result, the cutting resistance is increased, the straight advancing property of the drill is degraded.

SUMMARY OF THE INVENTION

In view of the foregoing defects, an object of the present invention is to provide a drill which has a small diameter but deteriorates neither in rigidity like the type shown in FIG. 1 nor in cutting chip discharging property like the type having one cut blade and one cutting chip discharge groove, and which is extremely excellent in practical use while performing the enhancement in hole position precision by a simple improvement.

The essence of the invention will now be described with reference to the drawings.

According to a primary aspect of the invention, there is provided a drill in which a chisel edge 6 is provided at a tip end portion, a spiral first chip discharging groove 1 and a spiral second chip discharging groove 2 are provided, a land portion 3, 4 is provided between the first chip discharging groove 1 and the second chip discharging groove 2, and a cut blade 5 is provided at an edge of a rake surface 7 of the first chip discharging groove 1, characterized in that the first chip discharging groove 1 and the second chip discharging groove 2 are provided asymmetrically with respect to a drill rotational center O and a land portion 3 behind the first chip discharging groove 1 is larger than a land portion 4 behind the second chip discharging groove 2.

Also, according to a second aspect of the invention, in the drill according to the primary aspect of the invention, an edge 9a of a wall surface 9 of the second chip discharging groove 2 directed in a drill rotational direction is adapted not to exhibit a cutting effect.

Also, according to a third aspect of the invention, in the drill according to the primary aspect of the invention, an angle θ1 defined by a line connecting an outer circumferential side end portion X of the cut blade 5 of the first chip discharging groove 1 and the drill rotational center O and a line connecting an outer circumferential side end portion Y of an opposite surface 10 to a wall surface 9 of the second chip discharging groove 2 directed in a drill rotational direction and the drill rotational center is set to be 40° or more and less than 180°.

Also, according to a fourth aspect of the invention, in the drill according to the second aspect of the invention, an angle θ1 defined by a line connecting an outer circumferential side end portion X of the cut blade 5 of the first chip discharging groove 1 and the drill rotational center O and a line connecting an outer circumferential side end portion Y of an opposite surface 10 to the wall surface 9 of the second chip discharging groove 2 directed in the drill rotational direction and the drill rotational center is set to be 40° or more and less than 180°.

Also, according to a fifth aspect of the invention, in the drill according to any one of the first to fourth aspects of the invention, a part or all of a curved line in a cross-section of a wall surface of the first chip discharging groove 1 is the same as a part or all of a curved line in a cross-section of a wall surface of the second chip discharging groove 2.

Also, according to a sixth aspect of the invention, in the drill according to any one of the first to fourth aspects of the invention, a depth of the second chip discharging groove 2 is shallower than a depth of the first chip discharging groove 1.

Also, according to a seventh aspect of the invention, in the drill according to the fifth aspect of the invention, a depth of the second chip discharging groove 2 is shallower than a depth of the first chip discharging groove 1.

Also, according to an eighth aspect of the invention, in the drill according to any one of the first to fourth aspects of the invention, a length of the second chip discharging groove 2 is shorter than a length of the first chip discharging groove 1.

Also, according to a ninth aspect of the invention, in the drill according to the fifth aspect of the invention, a depth of the second chip discharging groove 2 is shallower than a depth of the first chip discharging groove 1.

Also, according to a tenth aspect of the invention, in the drill according to the sixth aspect of the invention, a depth of the second chip discharging groove 2 is shallower than a depth of the first chip discharging groove 1.

Also, according to an eleventh aspect of the invention, in the drill according to the seventh aspect of the invention, a depth of the second chip discharging groove 2 is shallower than a depth of the first chip discharging groove 1.

Also, according to a twelfth aspect of the invention, in the drill according to the eighth aspect of the invention, the length of the second chip discharging groove 2 is not longer than ½ of the length of the first chip discharging groove 1.

Also, according to a thirteenth aspect of the invention, in the drill according to the ninth aspect of the invention, the length of the second chip discharging groove 2 is not longer than ½ of the length of the first chip discharging groove 1.

Also, according to a fourteenth aspect of the invention, in the drill according to the tenth aspect of the invention, the length of the second chip discharging groove 2 is not longer than ½ of the length of the first chip discharging groove 1.

Also, according to a fifteenth aspect of the invention, in the drill according to the eleventh aspect of the invention, the length of the second chip discharging groove 2 is not longer than ½ of the length of the first chip discharging groove 1.

Also, according to a sixteenth aspect of the invention, in the drill according to any one of the first to fourth aspects of the invention, a first relief surface 8 and a second relief surface 11 confronting the first relief surface 8 are provided integrally therewith at the tip end portion, and a tip sharp portion is formed at the drill rotational center O.

Also, according to a seventeenth aspect of the invention, in the drill according to the fifth aspect of the invention, a first relief surface 8 and a second relief surface 11 confronting the first relief surface 8 are provided integrally therewith at the tip end portion, and a tip sharp portion is formed at the drill rotational center O.

Also, according to an eighteenth aspect of the invention, in the drill according to the sixth aspect of the invention, a first relief surface 8 and a second relief surface 11 confronting the first relief surface 8 are provided integrally therewith at the tip end portion, and a tip sharp portion is formed at the drill rotational center O.

Also, according to a nineteenth aspect of the invention, in the drill according to the seventh aspect of the invention, a first relief surface 8 and a second relief surface 11 confronting the first relief surface 8 are provided integrally therewith at the tip end portion, and a tip sharp portion is formed at the drill rotational center O.

Also, according to a twentieth aspect of the invention, in the drill according to the eighth aspect of the invention, a first relief surface 8 and a second relief surface 11 confronting the first relief surface 8 are provided integrally therewith at the tip end portion, and a tip sharp portion is formed at the drill rotational center O.

Also, according to a twenty-first aspect of the invention, in the drill according to the ninth aspect of the invention, a first relief surface 8 and a second relief surface 11 confronting the first relief surface 8 are provided integrally therewith at the tip end portion, and a tip sharp portion is formed at the drill rotational center O.

Also, according to a twenty-second aspect of the invention, in the drill according to the tenth aspect of the invention, a first relief surface 8 and a second relief surface 11 confronting the first relief surface 8 are provided integrally therewith at the tip end portion, and a tip sharp portion is formed at the drill rotational center O.

Also, according to a twenty-third aspect of the invention, in the drill according to the eleventh aspect of the invention, a first relief surface 8 and a second relief surface 11 confronting the first relief surface 8 are provided integrally therewith at the tip end portion, and a tip sharp portion is formed at the drill rotational center O.

Also, according to a twenty-fourth aspect of the invention, in the drill according to the twelfth aspect of the invention, a first relief surface 8 and a second relief surface 11 confronting the first relief surface 8 are provided integrally therewith at the tip end portion, and a tip sharp portion is formed at the drill rotational center O.

Also, according to a twenty-fifth aspect of the invention, in the drill according to the thirteenth aspect of the invention, a first relief surface 8 and a second relief surface 11 confronting the first relief surface 8 are provided integrally therewith at the tip end portion, and a tip sharp portion is formed at the drill rotational center O.

Also, according to a twenty-sixth aspect of the invention, in the drill according to the fourteenth aspect of the invention, a first relief surface 8 and a second relief surface 11 confronting the first relief surface 8 are provided integrally therewith at the tip end portion, and a tip sharp portion is formed at the drill rotational center O.

Also, according to a twenty-seventh aspect of the invention, in the drill according to the fifteenth aspect of the invention, a first relief surface 8 and a second relief surface 11 confronting the first relief surface 8 are provided integrally therewith at the tip end portion, and a tip sharp portion is formed at the drill rotational center O.

With such an arrangement, it is possible to provide a drill which has a small diameter but deteriorates neither in rigidity like the type having two cut blades and two cutting chip discharging grooves nor in cutting chip discharging property like the type having one cut blade and one cutting chip discharge groove, and which is extremely excellent in practical use while performing the sufficient enhancement in hole position precision by a simple improvement.

MODE FOR EMBODYING POSSIBLE BEST MODE

An embodiment for embodying a possible best mode will briefly be described together with effects with reference to the accompanying drawings.

A first cutting chip discharging groove 1 and a second cutting chip discharging groove 2 are provided in non-symmetrical positions with respect to a drill rotational center O so that a land portion 3 behind the first cutting chip discharging groove 1 is greater in size than a land portion 4 behind the second chip discharging groove 2 whereby a backup amount of a cut blade 5 may be set to be sufficiently large and in addition, the cutting chips cut by the second cutting chip discharging groove 2 of a chisel edge 6 may be discharged by the second cutting chip discharging groove 2. It is therefore possible to provide a drill which has a small diameter but deteriorates neither in rigidity like the type having two cut blades and two cutting chip discharging grooves 2 nor in cutting chip discharging property like the type having one cut blade and one cutting chip discharge groove, and which performs the sufficient enhancement in hole position precision by a simple improvement.

DESCRIPTION OF THE PREFERRED EMBODIMENTS

Embodiments of the invention will now be described with reference to FIGS. 2 to 7. First, second and third embodiments are shown in FIGS. 2 to 4, FIG. 5 and FIG. 6, respectively.

Figure 2:
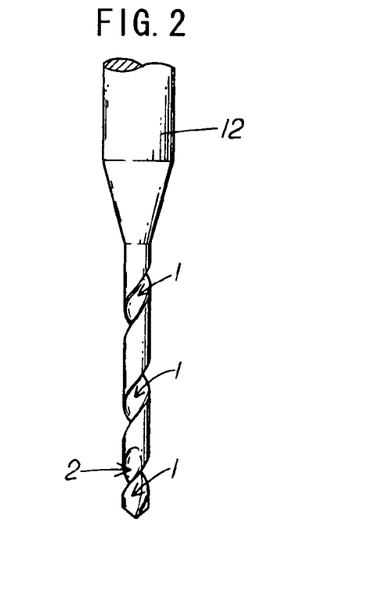
FIG. 2 is a schematic illustrative side elevational view of a first embodiment.
Figure 3:
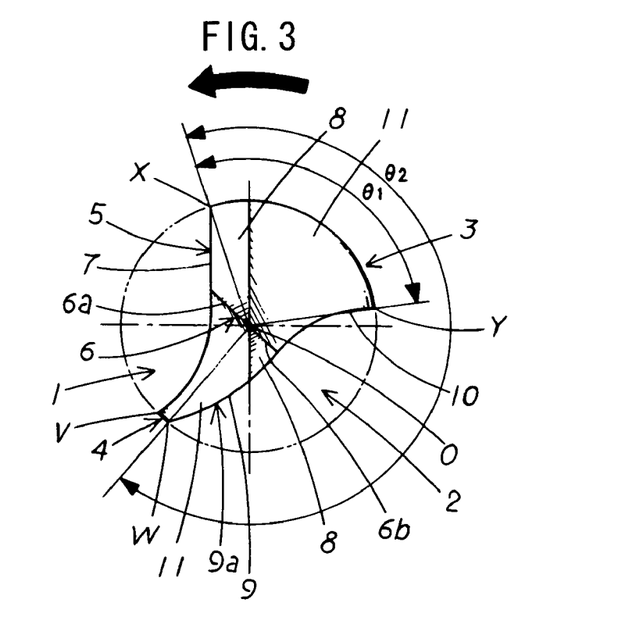
FIG. 3 is a schematic illustrative frontal view of the first embodiment.
Figure 4:
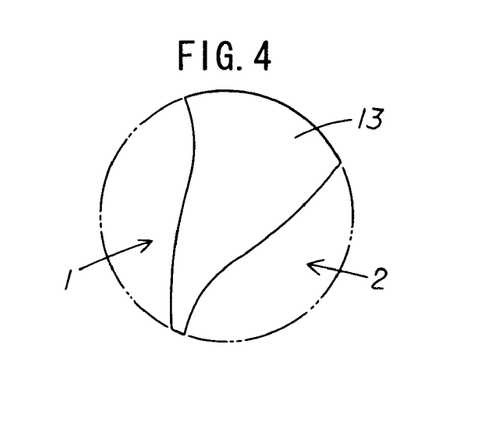
FIG. 4 is a schematic illustrative cross-sectional view of the first embodiment.
Figure 5:
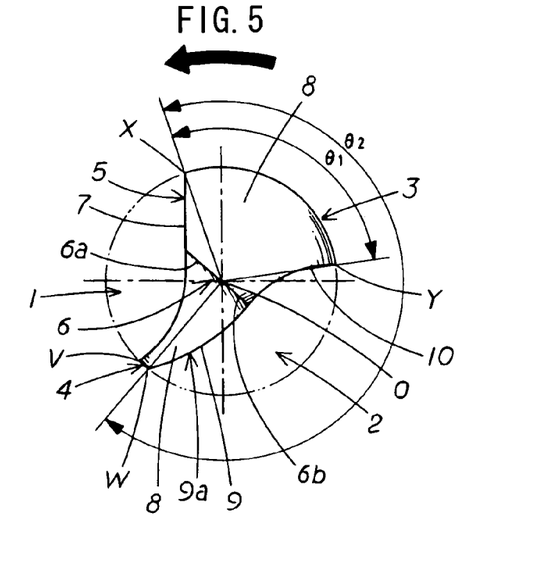
FIG. 5 is a schematic illustrative frontal view of a second embodiment.

The first embodiment is directed to a drill in which a chisel edge 6 is provided at a tip end portion; a first spiral cutting chip discharging groove 1 and a second spiral cutting chip discharging groove 2 are provided; land portions 3 and 4 are provided between the first chip cutting discharging groove 1 and the second chip cutting discharging groove 2; and a cut blade 5 is provided at an edge of a rake surface 7 of the first cutting chip discharging groove 1. The first cutting chip discharging groove 1 and the second cutting chip discharging groove 2 are provided in non-symmetrical positions with respect to the drill rotational center O. The land portion 3 behind the first cutting chip discharging groove 1 is set to be larger in size than the land portion 4 behind the second cutting chip discharging groove 2.

More specifically, as shown in FIG. 2, in the first embodiment, a shank portion 12 coupled with a tool mounting portion of a drilling machine is provided at a proximal end portion. The drill is mounted on the drilling machine to perform the boring work onto a printed circuit board or the like.

Each part will now be described more specifically.

An angle $\theta_1$ (an angle $\theta_{11}$ in the conventional case) defined between a line connecting an outer circumferential end portion X of the cut blade 5 of the first cutting chip discharging groove 1 and the drill rotational center O and a line connecting an outer circumferential side end portion Y of an opposite surface 10 to a wall surface 9 directed in the drill rotational direction of the second cutting chip discharging groove 2 and the drill rotational center O is set in the range of not smaller than 40° to not greater than 180°.

This is why if the angle is 40° or less, it is impossible to keep the backup amount of the cut blade 5, whereas the angle is greater than 180°, the land portion 3 would come into contact with an inner wall of the boring hole so that precision of the hole position and roughness of the inner wall would be deteriorated. This phenomenon would occur in the case where the chisel edge 6 is eccentric from the center of the drill outer circumference and close to the X-portion. In general, the chisel edge 6 passes through the center of the drill outer circumference and the drill rotational center is identified with the center of the drill outer circumference. However, in the case where the chisel edge 6 is eccentric from the center of the drill outer circumference and close to the X-portion, the drill rotational center O upon cutting after the drill has come into contact with a material to be cut would also be eccentric to the X-direction. As a result, the distance from the outer circumference side end portion X of the cut blade 5 to the drill rotational center O is shorter than the distance from the drill rotational center O of an extension line of the line of above-described distance to the outer circumferential end portion of the land portion 3, so that the land portion 3 would come into contact with the inner wall of the hole to be bored to deteriorate the hole position precision and the roughness of the inner wall.

More specifically, in the first embodiment, the above-described angle $\theta_1$ is set at about 120°. Accordingly, the land portion 4 behind the second cutting chip discharging groove 2 is set to have a size that is to be necessary at minimum so that the land portion 3 behind the first cutting chip discharging groove 1 may be set to be large enough.

Also, the cut blade 5 has the drill rotational direction of the first cutting chip discharging groove 1 is provided along the cross ridge portion between the rake surface 7 and the above-described relief surface 8, so that the cut blade 5 and the chisel edge 6 are adapted to cut the material to be cut.

Accordingly, the chips by the above-described cut blade 5 and the chisel edge 6a on the side of the first cutting chip discharging groove 1 are to be discharged from the first cutting chip discharging groove 1, and the chips by the chisel edge 6b on the side of the second cutting chip discharging groove 2 are to be discharged from the second cutting chip discharging groove 2.

Namely, in the first embodiment, only one cut blade 5 is provided on the side of the first cutting chip discharging groove 1 while providing the first cutting chip discharging groove 1 and the second cutting chip discharging groove 2, whereby it is of course possible to well discharge the chips by the cut blade 5 and the chisel edge 6, in addition, it is possible to perform the cutting work by the cut blade 5 without fail, and the land portion 4 behind the second cutting chip discharging groove 2 is made as small as possible to thereby make the backup amount of the cut blade 5 (land portion 3) as large as possible, to make it possible to realize high rigidity.

Also, with respect to the size of the land portion 4, it is preferable that an angle defined among an outer side end portion V of the first cutting chip discharging groove 1 on the side of the land portion 4, the drill rotational center O and an outer circumferential side end portion W of the second cutting chip discharging groove 2 on the side of the land portion 4 be set at not smaller than 0° to not greater than 80°. In the first embodiment, the angle is set at 20°.

In the case where the angle is set at 0°, the first cutting chip discharging groove 1 and the second cutting chip discharging groove 2 would be substantially connected to each other so that the chips by the cut blade 5 and the chisel edge 6a to be inherently discharged along the first cutting chip discharging groove 1 would enter into the second cutting chip discharging groove 2 and the cutting chips by the chisel edge 6b to be inherently received or discharged by the second cutting chip discharging groove 2 would be introduced into the first cutting chip discharging groove 1 so that the chips would not be discharged smoothly, which would become the cutting resistance to deteriorate the hole position precision and the roughness of the inner wall.

Also, in the first embodiment, as described above, the land portion 4 behind the second cutting chip discharging groove 2 is set to be smaller in size than the land portion 3 behind the first cutting chip discharging groove 1, whereas the edge 9a of the wall surface 9 directed in the drill rotational direction of the second cutting chip discharging groove 2 is set to be merged into the cut blade 5 in the axial direction.

Accordingly, a cut blade corresponding to the cut blade 5 in the first cutting chip discharging groove 1 is not formed in the edge 9a of the wall surface 9 directed to the drill rotational direction of the second cutting chip discharging groove 2. Accordingly, this narrow land portion 4 is not subjected to the cutting resistance. To this extent, it is possible to prevent the hole position precision from being degraded. (The cut blade 5 mainly serves to perform the cutting effect, and the wide land portion 3 is subjected to the cutting resistance by the cutting effect.) Also, as shown in FIG. 4, a part or all of the curve in the cross-section of the wall surface of the first cutting chip discharging groove 1 (i.e., the curved surface forming the wall surface of the first cutting chip discharging groove 1) is set to be the same as a part or all of the curve in the cross-section of the wall surface of the second cutting chip discharging groove 2 (i.e., the curved surface forming the wall surface of the second cutting chip discharging groove 2). In the case of the first embodiment (in the case shown in FIG. 4), all of the curve in the cross-section of the wall surface of the first cutting chip discharging groove 1 (i.e., the curved surface forming the wall surface of the first cutting chip discharging groove 1) is set to be the same as all of the curve in the cross-section of the wall surface of the second cutting chip discharging groove 2 (i.e., the curved surface forming the wall surface of the second cutting chip discharging groove 2). Incidentally, reference numeral 13 denotes a drill body in FIG. 4.

Accordingly, since it is possible to form the first cutting chip discharging groove 1 and the second cutting chip discharging groove with the same grinding stone, it is possible to easily and effectively form the first cutting chip discharging groove 1 and the second cutting chip discharging groove.

Also, it is possible to form the depth of the second cutting chip discharging groove 2 to be smaller than the depth of the first cutting chip discharging groove 1. The amount of the chips to be discharged from the second cutting chip discharging groove 2 is smaller than that of the chips to be discharged from the first cutting chip discharging groove 1. (The chips to be cut by the chisel edge 6b on the side of the second cutting chip discharging groove 2 is to be discharged from the second cutting chip discharging groove 2.) It is possible to discharge the sufficient amount of chips even if the second cutting chip discharging groove 2 is shallower than the first cutting chip discharging groove 1. Thus, it is possible to keep the thickness of the drill and to further enhance the rigidity of the drill. Accordingly, in this case, apart of the curve in the cross-section of the wall surface of the first cutting chip discharging groove 1 (i.e., the curved surface forming the wall surface of the first cutting chip discharging groove 1) is set to be the same as all of the curve in the cross-section of the wall surface of the second cutting chip discharging groove 2 (i.e., the curved surface forming the wall surface of the second cutting chip discharging groove 2).

More specifically, the depth of the second cutting chip discharging groove 2 is smaller than a radius of the drill but not smaller than one-third of the radius of the drill, and more preferably, the depth of the second cutting chip discharging groove 2 is set at about two-thirds of the radius of the drill.

In the case where the depth of the second cutting chip discharging groove 2 is not smaller than the radius of the drill, there is no chisel edge at the center of the outer circumferential circle of the drill, and inevitably, the drill rotational center O upon cutting is located eccentrically to degrade the hole positioning precision. Also, in the case where the depth of the second cutting chip discharging groove 2 is not greater than one-third of the radius of the drill, the capacity of the second cutting chip discharging groove 2 is too small. Accordingly, it is impossible to discharge the sufficient amount of chips by the chisel edge 6b. This becomes the cutting resistance to degrade the hole position precision and the roughness of the inner all. Also, since the chisel edge 6b is elongated, the cutting resistance upon cutting is increased, and in the extreme case, the hole position precision is degraded to damage the drill.

Also, in the first embodiment, in order to enhance the rigidity of the drill, the cutting chip discharge grooves are formed so that the depth thereof is gradually shallow toward the proximal end portion of the drill.

Also, the length of the second cutting chip discharging groove 2 is set to be smaller than that of the first cutting chip discharging groove 1. Accordingly, the rigidity of the drill is enhanced so that the hole position precision is enhanced. Since the amount of the chips to be discharged from the second cutting chip discharging groove 2 is small, it is unnecessary to form the second cutting chip discharging groove 2 up to the proximal end portion of the drill like the first cutting chip discharging groove 1.

In particular, in the case where the length of the second cutting chip discharging groove 2 is not greater than ½ of the first cutting chip discharging groove 1, the hole position precision is kept well, whereas in the case where the length of the second cutting chip discharging groove 2 is greater than ½ of the first cutting chip discharging groove 1, the chip discharging property is kept well. Accordingly, it is advisable to select the best one depending upon the use condition.

Incidentally, in the first embodiment, as shown in FIG. 4, although the cutting chip discharging grooves having the inverted J-shape are used, it is of course possible to use any other groove shape such as a semi-circular shape.

A second confronting relief surface 11 confronting with the first relief surface 8 is provided at the tip end, and a tip end sharp edge portion is provided at the drill rotational center O.

More specifically, the cut blade 5 is set at a predetermined tip end angle; the first relief surface 8 is set at a predetermined angle behind the cut blade 5; the second relief surface 11 is formed integrally therewith at a different angle from a set angle of the first relief surface 8 behind the first relief surface 8; and furthermore, the above-described first relief surface 8 and the above-described second relief surface 11 are provided at positions that are different in phase by 180° from the drill rotation center O. The cross ridge portion between the first relief surface 8 and the second relief surface 11 connected with the above-described cut blade 5 and the first relief surface 8 and the second relief surface 11 having the different phase of 180° is set to be the chisel edge 6. The point at which the four relief surfaces (so-called, above-described two first relief surfaces 8 and the above-described two second relief surfaces 11) are crossed with each other is identified with the drill rotational center O to be set at the tip end sharp end (chisel point) (see FIG. 3). Accordingly, due to the existence of the chisel point, it is possible to obtain a good bite to further enhance the hole position precision.

As described above, in the first embodiment, the confronting first relief surface 8 and the confronting second relief surface 11 are connected to each other. However, it is possible to set the chisel edge 6 only by the first relief surface 8 as in the second embodiment as shown in, for example, FIG. 5. In this case, it is possible to produce the drill in lower cost. (In the second embodiment shown in FIG.

5, there is no chisel point like the embodiment shown in FIG. 3 but only the chisel edge 6 is formed. The other structure is the same as that of the first embodiment shown in FIGS. 2 to 4.)

Figure 6:
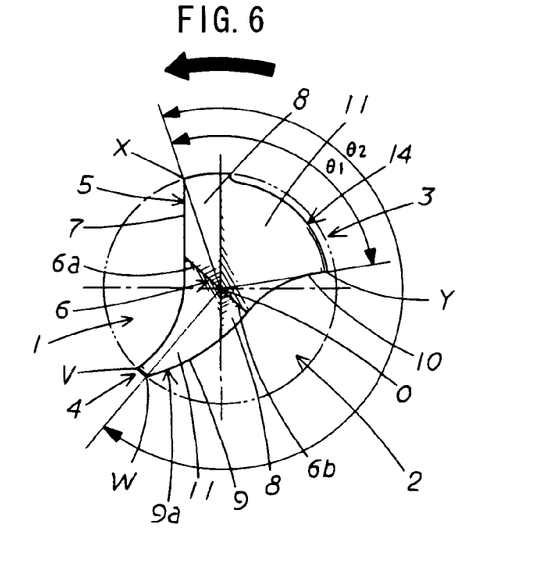
FIG. 6 is a schematic illustrative frontal view of a third embodiment.

Also, FIG. 6 shows a third embodiment in which a second formed surface 14 is formed in the land portion 3. In this case, it is possible to realize a drill that may move within the interior of the machined hole more smoothly. The other structure is the same as that of the first embodiment shown in FIGS. 2 to 4.

Figure 7:
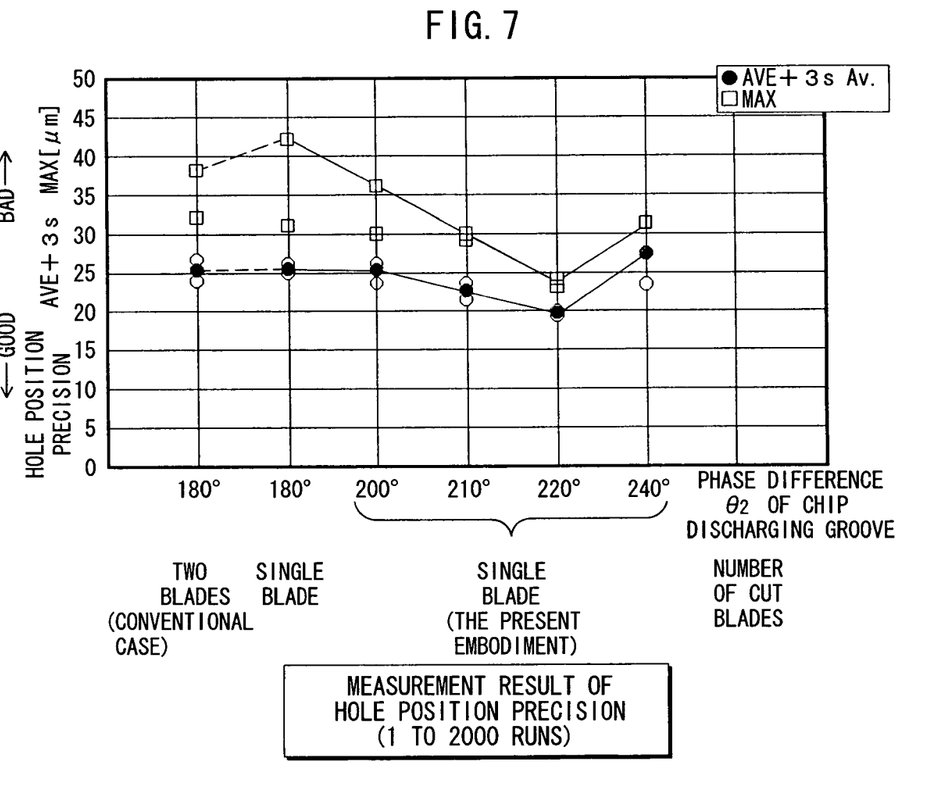
FIG. 7 is a graph in which hole position precision is compared between the conventional case and the embodiments.

FIG. 7 shows the results of the hole position precision by changing the phase difference $\theta_2$ of the second cutting chip discharging groove 2 to the first cutting chip discharging groove 1. From FIG. 7, it was confirmed that, in the drill having the above-described arrangement, it was possible to obtain the best hole position precision if the phase difference $\theta_2$ was set at 220° (at the position different from the case of the point-symmetrical position with respect to the drill rotational center O by 40°). Incidentally, even in the case where the above-described phase difference $\theta_2$ was set at 200° or 210°, it was confirmed to obtain the better hole position precision than that of the conventional cutting chip discharging grooves (i.e., in which the phase difference $\theta_{12}$ of the first cutting chip discharging groove and the second cutting chip discharging groove is set at 180°).

In the first, second and third embodiments with the above-described structure, the first cutting chip discharging groove 1 and the second cutting chip discharging groove 2 are provided in asymmetrical positions with respect to the drill rotational center O so that the land portion 3 behind the first cutting chip discharging groove 1 is greater than the land portion 4 behind the second cutting chip discharging groove 2. Accordingly, it is possible to set the backup amount of the cut blade 5 to be large and in addition, it is possible to discharge the chips by the chisel edge 6b on the side of the second cutting chip discharging groove 2 by the second cutting chip discharging groove 2. Accordingly, even if the diameter of the drill is small, it is possible to sufficiently enhance the hole position precision with a simple improvement without reduction in rigidity to an extent of the type with the two cut blades and the two cutting chip discharging grooves and without reduction in cutting chip discharging property to an extent of the type with the single cut blade and the single cutting chip discharging groove.

Namely, in a small diameter drill having a diameter of 0.1 mm, a feed amount is several micrometers per one turn of the drill. Not only is it difficult to keep the sufficient rigidity due to the small diameter but also, as described in the background of the invention, since the glass fiber diameter is several micrometers, the non-uniformity of the material to be machined and the undulations of the glass fiber sensitively affect the hole position precision. Accordingly, it would be impossible to obtain the high quality of holes with the conventional two-blade drill as shown in FIG. 1. According to the first, second and third embodiments, it is possible to ensure the high quality of machining holes without any reduction in hole position precision even if a printed circuit board or the like which is a composite material having non-uniformity unlike the steel material or the like and in which the undulations of the glass fiber sensitively affects the hole position precision is to be machined by a drill having a small diameter.

According to the first, second and third embodiments, it is possible to provide a drill which has a small diameter but deteriorates neither in rigidity like the type having the two cut blades and the two cutting chip discharging grooves nor in cutting chip discharging property like the type having one cut blade and one cutting chip discharge groove, and which is extremely excellent in practical use while performing the sufficient enhancement in hole position precision by a simple improvement.

What is claimed is:

1. A drill comprising:
   a chisel edge, provided at a tip end portion;
   a spiral first chip discharging groove and a spiral second chip discharging groove;
   a land portion provided between the first chip discharging groove and the second chip discharging groove;
   a cut blade provided at an edge of a rake surface of the first chip discharging groove, wherein the first chip discharging groove and the second chip discharging groove are provided asymmetrically with respect to a drill rotational center and a land portion, which is behind the cut blade of the first chip discharging groove, is larger than another land portion, which is in front of the cut blade of the first chip discharging groove;
   wherein an edge of a wall surface of the second chip discharging groove facing in a drill rotational direction does not include a cut blade anywhere along its entire length.

2. The drill according to claim 1, wherein an angle defined by a line connecting an outer circumferential side end portion of the cut blade of the first chip discharging groove and the drill rotational center and a line connecting an outer circumferential side end portion of an opposite surface to a wall surface of the second chip discharging groove directed in a drill rotational direction and the drill rotational center is set to be 40° or more and less than 180°.

3. The drill according to claim 1, wherein an angle defined by a line connecting an outer circumferential side end portion of the cut blade of the first chip discharging groove and the drill rotational center and a line connecting an outer circumferential side end portion of an opposite surface to the wall surface of the second chip discharging groove directed in the drill rotational direction and the drill rotational center is set to be 40° or more and less than 180°.

4. The drill according to any one of claims 2 or 3, wherein all of a curved line in a cross-section of a wall surface of the second chip discharging groove is the same as a part or all of a curved line in a cross-section of a wall surface of the first chip discharging groove.

5. The drill according to claim 4, wherein a depth of the second chip discharging groove is shallower than a depth of the first chip discharging groove.

6. The drill according to claim 5, wherein a length of the second chip discharging groove is shorter than a length of the first chip discharging groove.

7. The drill according to claim 6, wherein the length of the second chip discharging groove is not longer than ½ of the length of the first chip discharging groove.

8. The drill according to claim 7, wherein a first relief surface and a second relief surface confronting the first relief surface are provided integrally therewith at the tip end portion, and a tip sharp portion is formed at the drill rotational center.

9. The drill according to claim 4, wherein a length of the second chip discharging groove is shorter than a length of the first chip discharging groove.

10. The drill according to claim 9, wherein the length of the second chip discharging groove is not longer than ½ of the length of the first chip discharging groove.

11. The drill according to claim 10, wherein a first relief surface and a second relief surface confronting the first relief surface are provided integrally therewith at the tip end portion, and a tip sharp portion is formed at the drill rotational center.

12. The drill according to claim 9, wherein a first relief surface and a second relief surface confronting the first relief surface are provided integrally therewith at the tip end portion, and a tip sharp portion is formed at the drill rotational center.

13. The drill according to claim 4, wherein a first relief surface and a second relief surface confronting the first relief surface are provided integrally therewith at the tip end portion, and a tip sharp portion is formed at the drill rotational center.

14. The drill according to claim 5, wherein a first relief surface and a second relief surface confronting the first relief surface are provided integrally therewith at the tip end portion, and a tip sharp portion is formed at the drill rotational center.

15. The drill according to claim 6, wherein a first relief surface and a second relief surface confronting the first relief surface are provided integrally therewith at the tip end portion, and a tip sharp portion is formed at the drill rotational center.

16. The drill according to any one of claims 2 or 3, wherein a depth of the second chip discharging groove is shallower than a depth of the first chip discharging groove.

17. The drill according to claim 16, wherein a length of the second chip discharging groove is shorter than a length of the first chip discharging groove.

18. The drill according to claim 17, wherein the length of the second chip discharging groove is not longer than ½ of the length of the first chip discharging groove.

19. The drill according to claim 18, wherein a first relief surface and a second relief surface confronting the first relief surface are provided integrally therewith at the tip end portion, and a tip sharp portion is formed at the drill rotational center.

20. The drill according to claim 16, wherein a first relief surface and a second relief surface confronting the first relief surface are provided integrally therewith at the tip end portion, and a tip sharp portion is formed at the drill rotational center.

21. The drill according to claim 17, wherein a first relief surface and a second relief surface confronting the first relief surface are provided integrally therewith at the tip end portion, and a tip sharp portion is formed at the drill rotational center.

22. The drill according to any one of claims 2 or 3, wherein a length of the second chip discharging groove is shorter than a length of the first chip discharging groove.

23. The drill according to claim 22, wherein the length of the second chip discharging groove is not longer than ½ of the length of the first chip discharging groove.

24. The drill according to claim 23, wherein a first relief surface and a second relief surface confronting the first relief surface are provided integrally therewith at the tip end portion, and a tip sharp portion is formed at the drill rotational center.

25. The drill according to claim 22, wherein a first relief surface and a second relief surface confronting the first relief surface are provided integrally therewith at the tip end portion, and a tip sharp portion is formed at the drill rotational center.

26. The drill according to any one of claims 2 or 3, wherein a first relief surface and a second relief surface confronting the first relief surface are provided integrally therewith at the tip end portion, and a tip sharp portion is formed at the drill rotational center.

* * * * *

UNITED STATES PATENT AND TRADEMARK OFFICE
CERTIFICATE OF CORRECTION

PATENT NO. : 7,354,229 B2  Page 1 of 1
APPLICATION NO. : 11/124095
DATED : April 8, 2008
INVENTOR(S) : Hideo Wakui, Shoichi Takahashi and Hidehito Watanabe It is certified that error appears in the above-identified patent and that said Letters Patent is hereby corrected as shown below:

Claim 1, column 10, line 11, insert --and-- following "groove;"

Cancel claim 2, column 10, lines 25-29

Claim 4, column 10, line 41, delete "any one of claims 2 and 3" and insert --claim 3--

Claim 16, column 11, line 24, delete "any one of claims 2 and 3" and insert --claim 3--

Claim 22, column 12, line 12, delete "any one of claims 2 and 3" and insert --claim 3--

Claim 26, column 12, line 31, delete "any one of claims 2 and 3" and insert --claim 3--

Signed and Sealed this

Second Day of June, 2009

JOHN DOLL
*Acting Director of the United States Patent and Trademark Office*